United States Patent
Reykowski

(10) Patent No.: US 6,822,846 B2
(45) Date of Patent: Nov. 23, 2004

(54) STANDING WAVE BARRIER

(75) Inventor: Arne Reykowski, Erlangen (DE)

(73) Assignee: Siemens Aktiengesellschaft, Münich (DE)

( * ) Notice: Subject to any disclaimer, the term of this patent is extended or adjusted under 35 U.S.C. 154(b) by 7 days.

(21) Appl. No.: 10/377,544

(22) Filed: Feb. 28, 2003

(65) Prior Publication Data

US 2003/0173099 A1 Sep. 18, 2003

(30) Foreign Application Priority Data

Mar. 15, 2002 (DE) ......................................... 102 11 535

(51) Int. Cl.$^7$ .............................................. H01G 4/005
(52) U.S. Cl. ..................... 361/303; 174/28; 174/102 R; 174/36
(58) Field of Search ................................. 174/36, 75 C, 174/88 C, 28, 102 R; 361/303

(56) References Cited

U.S. PATENT DOCUMENTS 5,834,688 A  *  11/1998  Hill et al. ...................... 174/36
6,452,105 B2 *  9/2002  Badii et al. ............. 174/102 R
6,686,538 B2 *  2/2004  Yamamoto .................... 174/36
6,712,644 B1 *  3/2004  DeCormier ................. 439/578

FOREIGN PATENT DOCUMENTS

DE  196 27 027  6/1997

* cited by examiner

Primary Examiner—Hung V. Ngo
(74) Attorney, Agent, or Firm—Schiff Hardin LLP

(57) ABSTRACT

An electrically conductive inside structure of a standing wave barrier surrounds a section of a conductor in a sub-region. It can be displaceably arranged on the conductor section and galvanically separated from it but can be inductively coupled to it. A basic wave trap surrounds the inside structure on a part of its length. It is galvanically connected to the inside structure and to a capacitor. The capacitor is galvanically connected to the inside structure.

11 Claims, 2 Drawing Sheets

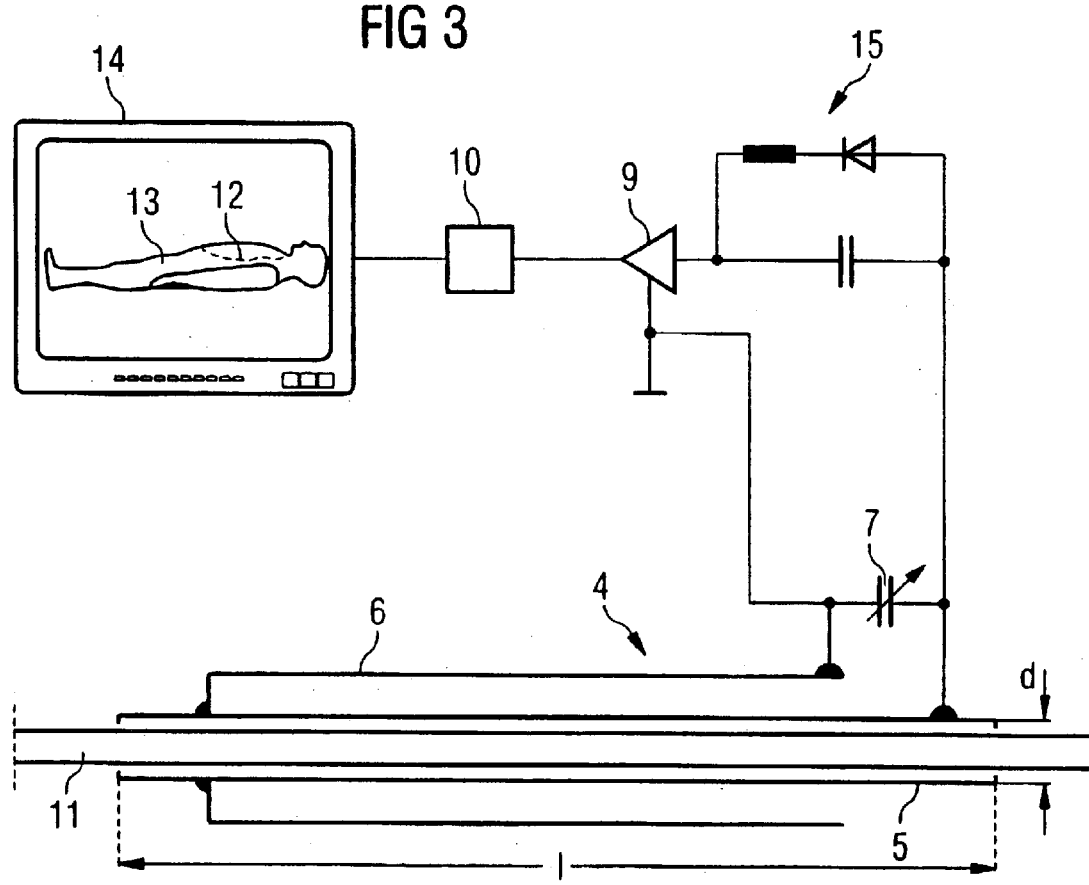

STANDING WAVE BARRIER

BACKGROUND OF THE INVENTION

1. Field of the Invention

The present invention is directed to a standing wave barrier for a conductor having a conductor section in which a standing wave would be induced by a high-frequency field without the standing wave barrier, of the type having at least one basic wave trap and a capacitor.

2. Description of the Prior Art

Standing wave barriers are well known. They are particularly utilized in magnetic resonance systems in order to prevent circularly or linearly polarized high-frequency magnetic fields from inducing high-frequency standing waves in the outside jacket of coaxial cables. In this application, thus, the outside jacket of the coaxial cable represents the conductor or the conductor section.

In known standing wave barriers, the basic wave trap is galvanically connected to the outside jacket and to a capacitor. The capacitor is also galvanically connected to the outside jacket. The basic wave trap surrounds the outside jacket over a part of its length.

Standing wave barriers of this type exhibit a number of disadvantages. In particular, that cannot be balanced until after mounting at the coaxial cable. Moreover, when a number of such-standing wave barriers are arranged on a single cable, they mutually influence each other. The balancing becomes more complicated as a result.

Further, guide wires of metal are known, particularly for catheters. These are thin wires that can be introduced into the inside of the body of a human and with which an item slipped over the wire, for example a catheter, can be guided to a specific location in the human body. The location is defined on the basis of medical criteria. Standing waves also can be induced in such guide wires. Devices for preventing standing waves for guide wires are still unknown.

SUMMARY OF THE INVENTION

An object of the present invention is to provide a standing wave barrier with which the aforementioned disadvantages of known barriers are eliminated. In particular, it is an object to provide such a standing wave barrier that is also employable for guide wires.

The object is achieved in a standing wave barrier having an electrically conductive interior structure which surrounds a region of the conductor section in which a standing wave can arise, and in which the conductor section is displaceable. The interior structure is galvanically separated from this region of the conductor section, but is inductively coupleable thereto. The basic wave trap surrounds the interior structure over a part of its length and is galvanically connected to the interior structure and a capacitor. The capacitor is galvanically connected to the interior structure.

As a result of the inventive design, it is possible to assemble and balance the standing wave barrier before being connected to the conductor. In particular, a number of standing wave barriers can be balanced individually and independently of one another, i.e. without mutual influencing. Due to the displaceability of the inside structure on the conductor section, the standing wave barrier also can be utilized for a guide wire.

In the simplest case, the standing wave barrier has a single wave trap, referred to below as a basic wave trap.

alternatively, the standing wave barrier may have two wave traps. In the case of two wave traps, the terms basic wave trap and auxiliary wave trap are employed in order to distinguish the wave traps from one another. Optionally, the wave traps can be fashioned identically or differing from one another.

When the inside structure is fashioned as hollow cylinder with a cylinder diameter and a cylinder length and the cylinder length is considerably longer than the cylinder diameter, a good coupling of the standing wave barrier to the conductor section is achieved. In this case, in particular, only a transverse electromagnetic wave can form between the conductor section and the standing wave barrier, which promotes the coupling of the standing wave barrier to the conductor section.

In an embodiment, the capacitor is a variable capacitance, allowing the standing wave barrier to be balanced in an especially easy way.

In an embodiment, the inside structure is clad in an electrically insulating fashion at the inside, it can also be employed at guide wires even if the guide wire itself has no insulation.

In a further embodiment, a high-frequency voltage drop across the capacitor is supplied via a pre-amplifier to an evaluation circuit with which the position of the conductor can be determined. In this case the location of the conductor can be reconstructed, particularly in magnetic resonance systems, as long as it is in the imaging volume. This is particularly significant for the localization of a guide wire in the body of a human (or of an examination subject in general).

A separating circuit with which the pre-amplifier can be decoupled from the capacitor and be arranged between the capacitor and the pre-amplifier, so the pre-amplifier is protected against damage in a magnetic resonance system (which operates with high power) in a simple way.

If the inside structure and the basic wave trap, and the auxiliary wave trap as well, are flexibly fashioned, then the standing wave barrier can be utilized in especially versatile ways.

DESCRIPTION OF THE DRAWINGS

FIG. 3 shows a further embodiment of standing wave barrier in accordance with the invention.

DESCRIPTION OF THE PREFERRED EMBODIMENTS

Figure 1:
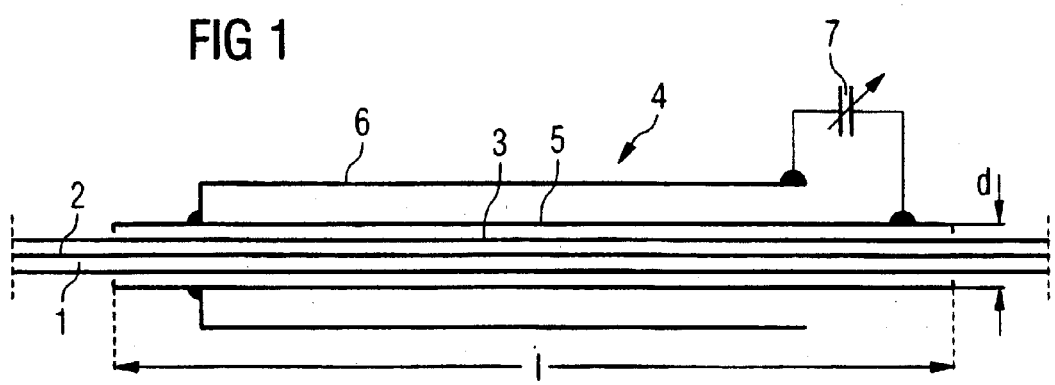
FIG. 1 illustrates a standing wave barrier in accordance with the invention.

As shown in FIG. 1, a coaxial cable 1 has a middle conductor 2 and a cable jacket 3. The middle conductor 2 carries, for example, a reception signal of a local coil (not shown) that is utilized in a magnetic resonance system. The magnetic resonance system generates a high-frequency magnetic resonance excitation field, among other things. The high-frequency magnetic resonance excitation field typically has a frequency between 8 and 200 MHz. Given a basic magnetic field of 1.5 T, for example, the frequency form the excitation and detection of proton spins amounts to 63.6 MHz.

The middle conductor 2 is shielded from external influences by the cable jacket 3. On the cable jacket 3 itself, a standing wave could be induced by the high-frequency magnetic resonance excitation field of the magnetic resonance system. The cable jacket 3 according to FIG. 1 is thus a conductor 3 in the sense of the present invention.

In order to prevent the induction of standing waves, a standing wave barrier 4 is present according to FIG. 1. According to FIG. 1, the standing wave barrier 4 has an electrically conductive inside structure 5, a basic wave trap 6 and a capacitor 7. The inside structure 5 surrounds the cable sheath 3 in a sub-region of a conductor section. The conductor section is indicated in FIG. 1 by vertical, broken lines that subdivide the coaxial cable 1. The standing wave barrier 4 prevents or suppresses the standing wave only in this conductor section.

The inside structure 5 is only inductively coupled to the cable sheath 3. It is galvanically separated from it. As a result of the exclusive inductive coupling of the inside structure 5 to the cable shield 3, moreover, the inside structure 5 can be displaceably arranged on the cable sheath 3.

The inside structure 5 is fashioned as a hollow cylinder. It has a cylinder diameter d. The inside structure 5 also has a cylinder length l over which it surrounds the cable sheath 3.

The cylinder length l is considerably greater than the cylinder diameter d. As a rule, the ratio of cylinder length l to cylinder diameter d amounts to between 8 and 15. This value, however, can also be upwardly or downwardly transgressed on a case-by-case basis. However, a dimensioning ratio of 3:1, preferably 5:1, should not be downwardly transgressed.

Due to the fashioning of the inside structure as an elongated hollow cylinder, a transverse electromagnetic wave forms between the inside structure 5 and the cable jacket 3. A good inductive coupling of the standing wave barrier 4 to the cable jacket 3 in accordance with the principles of the present invention achieved as a result.

As shown in FIG. 1, the basic wave trap 6 surrounds the inside structure 5 along a part of its length l. It is galvanically connected to the inside structure 5 and to the capacitor 7. The capacitor 7 is in turn galvanically connected to the inside structure 5. Given a suitable design of the basic wave trap 6 and of the capacitor 7, these two elements form a trap circuit. Due to the inductive coupling of this trap circuit to the cable jacket 3 via the inside structure 5, thus, standing waves on the cable jacket 3 are suppressed.

In order to be able to set the frequency at which the standing wave barrier 4 is especially effective, the capacitor 7 preferably has a variable capacitance.

The inside structure 5 can be fashioned in various ways. For example, it can be fashioned as a rigid metallic tube. Alternatively, it can also be fashioned as a flexible round strand. The basic wave trap 6 also can be fashioned to be rigid or flexible. Further, the inside structure 5 can be clad in electrically insulating fashion at the inside and/or outside.

Figure 2:
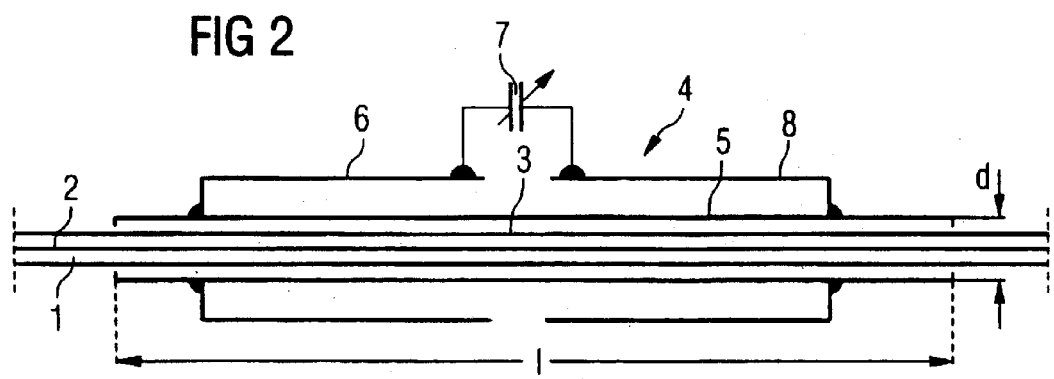
FIG. 2 shows a modification of the standing wave barrier of FIG. 1.

FIG. 2 shows a modification of the embodiment of FIG. 1. Here, an auxiliary wave trap 8 via which the capacitor 7 is galvanically connected to the inside structure 5 is provided in addition to the basic wave trap 6. As can be seen, the auxiliary wave trap 8 and the basic wave trap 6 are equivalent. In particular, it is possible to identically fashion the auxiliary wave trap 8 and the basic wave trap 6. In particular, the auxiliary wave trap 8 also can be flexibly fashioned, however, the wave traps 6, 8 can also be fashioned differently from each other.

FIG. 3 shows a supplement to the standing wave barrier 4 of FIG. 1. Of course, the modification according to FIG. 3 could also be applied given a standing wave barrier 4 according to FIG. 2. In FIG. 3, the conductor on which a standing wave is to be suppressed is fashioned as a guide wire 11. A guide wire is an element that is introduced into the body of an examination subject 13 (for example, a human 13).

After the introduction of the guide wire 11, an implement—usually medical—is then pushed along the guide wire 11. The implement can, for example, be a catheter.

According to FIG. 3, a high-frequency voltage drop across the capacitor 7 can be supplied to an evaluation circuit 10 via a pre-amplifier 9. As schematically indicated in FIG. 3, a position of the conductor 11 can then be identified with the evaluation circuit 10, insofar as said conductor 11 is situated inside an examination subject 13.

This is indicated in FIG. 3 with the broken line 12 that is displayed on a picture screen 14 together with an image of the examination subject 13 reconstructed elsewise.

Due to the introduction of the guide wire 11 into the body, of course, the guide wire 11 cannot be surrounded by the standing wave barrier 4 inside the body. When it is exposed to a high-frequency magnetic field in the body, the guide wire 11 therefore acts as a (poor) antenna.

Strong fields act on the guide wire 11 given the excitation of magnetic resonances. In this case, a coupling of the pre-amplifier 9 to the capacitor 7 would lead to a degradation of the pre-amplifier 9. Further, the pre-amplifier 9 would deteriorate the effect of the standing wave barrier 4 in the excitation case. A separating circuit 15 with which the pre-amplifier 9 can be decoupled from the capacitor 7 is therefore arranged between the capacitor 7 and the pre-amplifier 9. The separating circuit 15 can be optionally fashioned as a pure switch or—as shown in FIG. 3—as a detuning circuit.

The guide wire 11 also acts only as a poor antenna for the reception of magnetic resonance signals. It only receives magnetic resonance signals that arise from its immediate environment. It is precisely this property, however, that can be employed in order to determine the location of the guide wire 11 within the examination subject 13.

A decisive criterion of magnetic resonance examinations, is that the received signals can be unambiguously allocated to a specific location in space. The evaluation circuit 10 therefore can be programmed in a simple way so that it assesses the guide wire 11 as being present at a specific location when it determines any noteworthy signal level at all for this location. The position of the guide wire 11 in the examination volume thus can be determined insofar as it is in a medium (the examination subject 13) that can be excited to magnetic resonance at all. By correlating the position of the guide wire 11 with that of the examination subject 11, thus, the position of the guide wire 11 inside the examination subject 13 can also be determined, which is what is important.

As is apparent from the above, the employment of the standing wave barrier 4 at a guide wire 11 is only possible at all due to the displaceability of the inside structure 5 on the conductor 11. Other advantages also follow from this displaceability. The most important further advantage is that the standing wave barrier 4 can be assembled and tuned in advance. It is thus possible to first galvanically connect the electrically conductive inside structure to a basic wave trap 6 that surrounds the inside structure 5 on a part of its length l. The basic wave trap 6 can then be galvanically connected to a capacitor 7. The capacitor 7 can then in turn be galvanically connected to the inside structure—via the auxiliary wave trap 8 as warranted. Only after these steps have been implemented (in an arbitrary sequence) does it become necessary to introduce the conductor 3, 11 in which the standing wave is to be suppressed into the inside structure 5. It is already possible, however, to balance the standing wave barrier 4 before the introduction of the conductor 3, 11.

Although modifications and changes may be suggested by those skilled in the art, it is the intention of the inventor to embody within the patent warranted hereon all changes and modifications as reasonably and properly come within the scope of his contribution to the art.

I claim as my invention:

1. A standing wave barrier comprising:
   an interior structure adapted to surround a region of a conductor section in which a standing wave can arise, said interior structure allowing displacement of said region of said conductor section within said interior structure, and being galvanically separated from said region and inductively coupleable to said region;
   a basic wave trap surrounding said interior structure over a portion of a length of said interior structure and being galvanically connected to said interior structure;
   a capacitor galvanically connected to said basic wave trap and galvanically connected to said interior structure, said capacitor having a high-frequency voltage drop thereacross; and
   an evaluation circuit having a preamplifier for amplifying said voltage drop, and said evaluation circuit identifying a position of said conductor dependent on said voltage drop.

2. A standing wave barrier as claimed in claim 1 further comprising an auxiliary wave trap, said capacitor being galvanically connected to said interior structure via said auxiliary wave trap.

3. A standing wave barrier as claimed in claim 2 wherein said basic wave trap and said auxiliary wave trap are identical.

4. A standing wave barrier as claimed in claim 1 wherein said interior structure comprises a hollow cylinder with a cylinder diameter and a cylinder length, said cylinder length being significantly larger than said cylinder diameter.

5. A standing wave barrier as claimed in claim 1 wherein said capacitor has a variable capacitance.

6. A standing wave barrier as claimed in claim 1 wherein said interior structure has an electrically insulating cladding in an interior of said interior structure.

7. A standing wave barrier as claimed in claim 1 wherein said basic wave trap and said interior structure are flexible.

8. A standing wave barrier as claimed in claim 1 further comprising a separating circuit decoupling said capacitor from said pre-amplifier, connected between said capacitor and said preamplifier.

9. A standing wave barrier as claimed in claim 1 wherein said interior structure and said basic wave trap are flexible.

10. A standing wave barrier as claimed in claim 1 further comprising an auxiliary wave trap galvanically connecting said capacitor to said internal structure, and wherein said basic wave trap, said auxiliary wave trap and said interior structure are flexible.

11. A method for connecting a standing wave barrier to a section of a conductor wherein a standing wave can arise, comprising the steps of:
   providing a standing wave barrier with an electrically conductive interior structure that is galvanically connected to a basic wave trap of said standing wave barrier with said basic wave trap surrounding said interior structure over a part of a length of said interior structure;
   galvanically connecting said basic wave trap to a capacitor;
   galvanically connecting said capacitor to said interior structure;
   galvanically connecting said capacitor to said interior structure via an auxiliary wave trap; and
   introducing said conductor section into said interior structure only after galvanically connecting said interior structure, said basic wave trap and said capacitor.

* * * * *